United States Patent [19]

Mahler et al.

[11] Patent Number: 5,558,751
[45] Date of Patent: Sep. 24, 1996

[54] DUAL CATHODE SPUTTER COATING APPARATUS

[75] Inventors: Peter Mahler, Hainburg; Wolfgang Stang, Kefenrod; Michael Scherer, Rodenbach; Roland Gesche, Seligenstadt, all of Germany

[73] Assignee: Leybold Aktiengesellschaft, Hanau, Germany

[21] Appl. No.: 385,521

[22] Filed: Feb. 8, 1995

[30] Foreign Application Priority Data

Apr. 20, 1994 [DE] Germany ............... 44 13 655.2

[51] Int. Cl.$^6$ ................................. C23C 14/54
[52] U.S. Cl. ................. 204/298.26; 204/298.08; 204/298.11; 204/298.12
[58] Field of Search .............. 204/298.08, 298.11, 204/298.12, 298.18, 298.26, 298.06, 192.12

[56] References Cited

U.S. PATENT DOCUMENTS

| | | | |
|---|---|---|---|
| 3,562,142 | 2/1971 | Lamont, Jr. ............ | 204/192.12 |
| 3,718,572 | 4/1973 | Robinson et al. ...... | 204/298 |
| 4,560,462 | 12/1985 | Radford et al. ....... | 204/298.12 |
| 5,169,509 | 6/1992 | Latz et al. ............ | 204/298.03 |
| 5,372,694 | 12/1994 | Szczyrbowski ....... | 204/298.12 |

FOREIGN PATENT DOCUMENTS

| | | | |
|---|---|---|---|
| 549545 | 5/1993 | European Pat. Off. | |
| 3541621 | 7/1987 | Germany. | |
| 62-179115 | 8/1987 | Japan ............... | 204/298.18 |
| 61-270366 | 12/1987 | Japan. | |

OTHER PUBLICATIONS

Standley et al. (IBM Tech Disclosure Bulletin), "Mosaic Cathode Structure for Large Sputtering Systems" vol. 9 No. 2 Jul. 1966 pp. 190.

*Primary Examiner*—R. Bruce Breneman
*Assistant Examiner*—Rodney G. McDonald
*Attorney, Agent, or Firm*—Felfe & Lynch

[57] ABSTRACT

In a coating apparatus, a sputter cathode (1) has, directly side by side, two electrodes (2, 3) connected in common to a high-frequency generator and having each a target (9, 10). The targets (9, 10) of both electrodes (2, 3) abut one another each with a straight edge (11, 12). A dark space shield surrounds both electrodes (2, 3) and targets (9, 10) together.

3 Claims, 1 Drawing Sheet

DUAL CATHODE SPUTTER COATING APPARATUS

BACKGROUND OF THE INVENTION

The invention relates to a coating apparatus with a sputtering cathode which has an electrically conductive electrode connectable to a high-frequency generator on which an electrically nonconductive target defined by at least one straight edge is held by a solder bond and around which runs a dark space shield.

Coating apparatus of the above kind are now being manufactured and are generally known. Difficulties are encountered in such coating apparatus due to the solder bond between the electrode and the target on account of the greatly different expansion between the electrode and the target, for example when the target consists of aluminum oxide and the electrode of copper. Particularly in electrodes and targets of large area the target is often broken in such cases.

To prevent damage to the target, it is known to solder onto an electrode of large area a plurality of individual targets side by side like tiles on a wall, so as to avoid target breakage. It is disadvantageous in this case that this creates the danger of the evaporation of solder from between the individual targets, so that the coatings produced on the substrates are contaminated by the evaporated solder.

Instead of soldering a plurality of targets on a large-area electrode, it is also known in high-power coating apparatus to arrange two identical cathodes side by side, each with a target. In this case, however, it is a disadvantage that the sputtering rate decreases in the marginal areas of the targets. The result is that in both targets considerable residues of material remain due to marginal areas that are not or are incompletely evaporated. Furthermore, due to the two cathodes, the coating is irregular, especially when the substrates are situated precisely above the gap between the two cathodes.

SUMMARY OF THE INVENTION

The invention is addressed to the problem of constructing a coating apparatus of the kind described above so that, with it, large surface areas be coated rapidly, simultaneously and with great uniformity.

According to the invention the sputtering cathode has, directly side by side, two target bearing electrodes at common potential connected to the high-frequency generator. The targets of both electrodes abut one another at their straight edge, and the dark space shield encompasses both the electrodes and the targets together.

Since in the coating apparatus according to the invention the targets abut one another at a straight edge, the sputter rate does not diminish at these edges; instead, the cathode formed of two electrodes and two targets acts as a single cathode. Since no diminution of the sputter rate occurs between the targets, substrates disposed in front of the targets can be uniformly coated. In arranging them there is no need to pay heed to where the division between the two targets occurs. The cathode according to the invention is easy to handle in spite of its size, because it consists of two individual parts.

For the simultaneous coating of several substrates arranged side by side it is advantageous if, according to a further embodiment of the invention, the electrodes each have a rectangular electrode plate on which a target is soldered with a slight overhang at least toward the side on which the adjacent electrode plate is situated. This overhang permits the targets to abut without making it impossible for them to expand due to the heat that is created. Furthermore, the interstice between the electrode plates permits compensation of manufacturing tolerances. This interstice must, of course, be smaller than the distance between the electrodes and the dark space shield so that no plasma will burn therein.

The cathodes can be fed with especially great high-frequency powers if each of the two electrodes has on its side facing away from the target a lead-through in the wall of the coating apparatus and if these lead-throughs are connected to one another outside of the coating chamber by an electrical connection. Also the fastening of the cathode to a wall of the coating chamber is especially simple in such an embodiment.

The invention is susceptible of numerous embodiments. For the further explanation of its basic principle one of them is represented schematically in the drawing and is described hereinafter.

DETAILED DESCRIPTION OF THE PREFERRED EMBODIMENT

Figure 1:
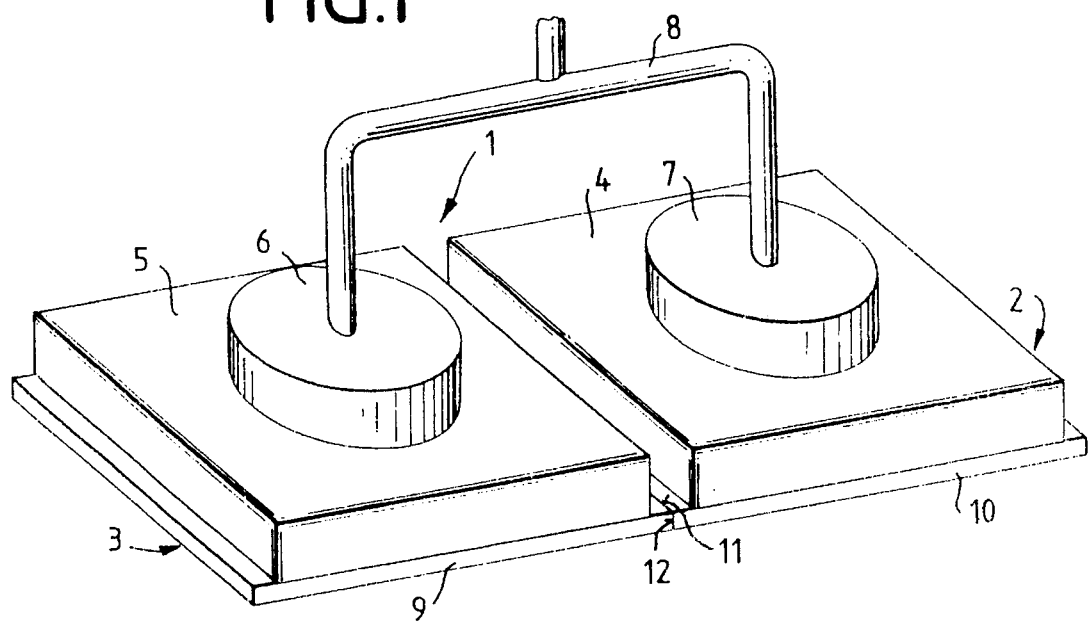
FIG. 1 is a perspective view of a sputter cathode according to the invention.

FIG. 1 shows a sputter cathode 1 which has two electrodes of copper arranged side by side. Each electrode 2, 3 is formed of a rectangular electrode plate 4, 5, and a lead-through 6, 7 of circular cross section is formed on its back. The two lead-throughs 6, 7 are joined together electrically by means of a connection 8. The high-frequency feed necessary for the sputtering is delivered through this connection 8.

A target 9, 10 is mounted by a solder joint on each electrode plate 4, 5, on the side of the latter opposite from the lead-throughs 6, 7. These targets 9, 10 consist, for example, of aluminum oxide. The targets 9, 10 project on all sides slightly beyond the edges of the electrode plates 4, 5, and abut one another between the electrode plates 4, 5, with a straight edge 11, 12.

Figure 2:
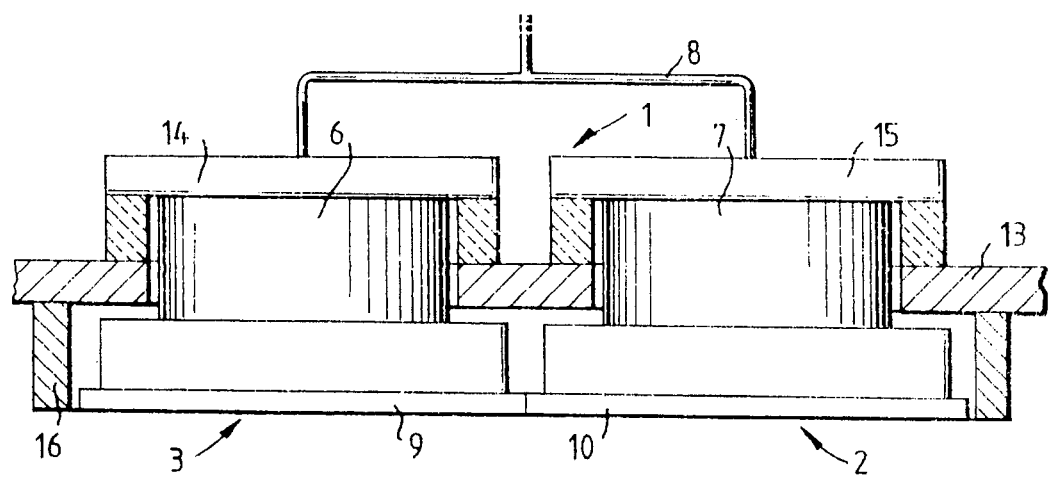
FIG. 2 is a longitudinal section through the sputter cathode in the installed state.

FIG. 2 shows how the sputter cathode 1 is fastened in a wall 13 of a coating apparatus by means of a holding plate 14, 15. Also, FIG. 2 shows a dark-space shield 16 which surrounds the electrodes 2 and 3 as a whole. It is important in this case that this dark space shield 16 does not pass between the electrodes 2 and 3, so that no drop in the sputter rates can occur at the edges 11 and 12. The dark space shielding 16 is grounded, as usual.

What is claimed is:

1. Sputter coating apparatus comprising a pair of side by side electrodes at common potential connected to a common power supply, a pair of electrically non-conductive targets soldered to respective electrodes, each having a straight edge which abuts the straight edge of the other target, and a common dark space shield surrounding both of said electrodes and said targets together.

2. Sputter coating apparatus as in claim 1 wherein said electrodes each comprise a rectangular plate having an edge which faces the edge of the other plate, said targets extending beyond the edges of the electrode plates.

3. Sputter coating apparatus as in claim 1 further comprising a coating chamber comprising a wall having aperture means therethrough, a pair of lead-throughs electrically connected to respective electrodes opposite from said targets, said lead-throughs extending through said aperture means, and connecting means which electrically connect said lead-throughs outside of said coating chamber.

* * * * *